United States Patent [19]

Van der Zande et al.

[11] Patent Number: 4,741,988
[45] Date of Patent: May 3, 1988

[54] PATTERNED POLYIMIDE FILM, A PHOTOSENSITIVE POLYAMIDE ACID DERIVATIVE AND AN ELECTROPHORETIC IMAGE-DISPLAY CELL

[75] Inventors: Johan M. Van der Zande; Lourens Minnema, both of Eindhoven, Netherlands

[73] Assignee: U.S. Philips Corp., New York, N.Y.

[21] Appl. No.: 858,476

[22] Filed: May 1, 1986

[30] Foreign Application Priority Data

May 8, 1985 [NL] Netherlands .......................... 8501304

[51] Int. Cl.⁴ .......................... G03C 5/00; B01D 13/02; C25D 13/00
[52] U.S. Cl. .................................... 430/312; 430/314; 430/319; 430/283; 430/324; 430/330; 204/299 R
[58] Field of Search .................. 204/299 R; 430/312, 430/314, 319, 283, 324, 330, 329

[56] References Cited

U.S. PATENT DOCUMENTS

| | | | |
|---|---|---|---|
| 4,040,831 | 8/1977 | Rubner et al. | 430/283 X |
| 4,123,346 | 10/1978 | Ploix | 204/299 R |
| 4,203,106 | 5/1980 | Dalisa et al. | 340/716 X |
| 4,620,916 | 11/1986 | Zwemer et al. | 204/299 R |
| 4,654,223 | 3/1987 | Araps et al. | 430/319 X |

FOREIGN PATENT DOCUMENTS

| | | |
|---|---|---|
| 0065352 | 11/1982 | European Pat. Off. ............ 430/283 |
| 2914619 | 10/1979 | Fed. Rep. of Germany . |
| 8202688 | 2/1984 | Netherlands . |

OTHER PUBLICATIONS

Liebert et al, "A 512 Character Electrophoretic Display", from *Conference Record of* 1980 *Biennial Display Research Conference:* Papers presented at Cherry Hill, N.J., Oct. 21-23, 1980.

*Primary Examiner*—Paul R. Michl
*Assistant Examiner*—Cynthia Hamilton
*Attorney, Agent, or Firm*—Norman N. Spain

[57] ABSTRACT

A method of manufacturing a polyimide pattern which is provided with a metal layer, such that a dual layer system is exposed in accordance with a certain pattern, which pattern contains a photosensitive polyamide acid derivative and a positive photoresist which is developed, provided with a metal layer and removed, after which, the polyamide acid derivative layer is developed and imidisied, as well as a new photosensitive polyamide acid derivative and an electrophoretic image-display cell.

7 Claims, 2 Drawing Sheets

PATTERNED POLYIMIDE FILM, A PHOTOSENSITIVE POLYAMIDE ACID DERIVATIVE AND AN ELECTROPHORETIC IMAGE-DISPLAY CELL

The invention relates to a method of forming on a substrate a patterned polyimide film which is provided with an electrically conductive layer at the surface facing away from the substrate.

German Pat. No. 2 914 619 describes a method of forming a polyimide pattern on a substrate. For this purpose, the substrate is provided with a layer of a photosensitive polyamide acid derivative which is then exposed patternwise to UV light, developed and finally converted to polyimide by subjecting it to a heat treatment.

It is an object of the invention to form a polyimide pattern on a substrate, the polyimide being provided with an electrically conductive layer at the surface facing away from the substrate, the conductive layer being of a metal, for example Cr, or of a metal oxide such as indium oxide.

This object is achieved in accordance with the invention by a method as described above which is characterized in that the substrate is provided with a layer of a photosensitive polyamide acid derivative onto which a layer of a positive photoresist is applied, after which the resultant is exposed patternwise, the photoresist layer is developed, an electrically conductive layer is applied to the photoresist layer which then removed by means of a lift-off process, the non-exposed parts of the layer of polyamide acid derivative are removed and the remaining exposed parts are subjected to a heat treatment and imidised to form polyimide.

The invention has the important and surprising advantage that the polyimide pattern obtained has very straight wall portions which are perpendicular to the substrate.

An advantageous embodiment of the method in accordance with the invention is characterized in that a positive photoresist is used the absorption wavelength of which differs from that of the photosensitive polyamide acid derivative, the exposure of the assembly in accordance with a certain pattern being carried out in two successive steps, the first step consisting in exposing the assembly in accordance with a desired pattern to light whose emission wavelength corresponds to the absorption wavelength of the photoresist, and the second step consisting in exposing the assembly in accordance with a desired pattern to light whose emission wavelength corresponds to the absorption wavelength of the photosensitive polyamide acid derivative.

This advantageous embodiment has the interesting and practical advantage that the first exposure step, in which the positive photoresist is exposed, is immediately followed by the second. In the second exposure step the polyamide acid derivative is exposed through the positive photoresist. Between the first and the second exposure step no development of the photoresist takes place. This means that, for example, between the first and the second exposure step the mask used for the patterned exposure does not have to be removed and repositioned. In particular the latter measure is costly and time-consuming.

In a further favorable embodiment of the method in accordance with the invention, a positive photoresist is used having an absorption wavelength in the near UV spectrum and a polyamide acid derivative having an absorption wavelength in the UV spectrum.

In a first exposure step the assembly is exposed to a deep UV light and, subsequently, in the second step to UV light. The positive photoresist which is not developed after the first exposure step transmits the UV light used in the second exposure step, such that the photosensitive polyamide acid derivative is actually exposed. The wavelength range of DUV light is approximately 180–260 nm, that of UV light is approximately 260 to 450 nm.

A suitable positive photoresist is p-isopropenyl methylketone. Preferably, a layer of polymethylmethacrylate is used having an absorption wavelength situated in the DUV spectrum, namely at $\lambda = 220$ nm.

It is also possible to use to positive photoresist whose absorption wavelength is situated in the UV range. An example thereof is a novolak-diazoquinone photoresist as marketed by Shipley and Hunt Waycoat. In order to obtain the best results such a photoresist must be developed after the first exposure.

In the method in accordance with the invention preferably use is made of, a photosensitive polyamide acid derivative which is obtained by making polyamide acid react with one or more compounds of formula 1

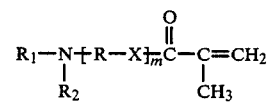

in which

R$_1$ is equal or unequal to R$_2$ and both represent a lower alkyl group having 1–4 carbon atoms or a hydrogen atom, R is an alkylene group having 1–5 carbon atoms, X is an oxygen atom of the group —N(R$_3$)—, in which R$_3$ is a hydrogen atom or a lower alkyl group having 1–4 carbon atoms, and m has the value 0 or 1, on the condition that in at least one compound the value of m is 1.

The reaction is carried out at a normal or slightly elevated temperature. Use is made of a solvent such as N-methypyrrolidone. Formula 10

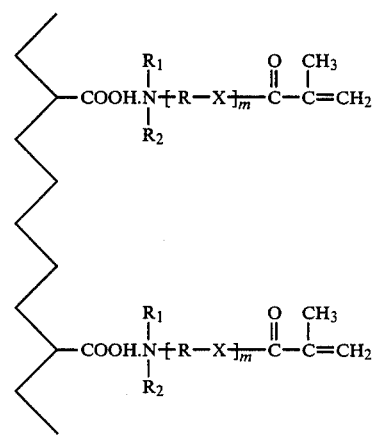

represents the end product. In this formula, the zigzag line represents the polyamide acid chain which contains various carboxyl groups. Two of these carboxyl groups are shown in formula 10. This carboxyl group forms a salt bridge together with the amino group of the methacrylate compound used, which salt bridge is indicated by a dot.

In a further advantageous embodiment, the method in accordance with the invention makes use of a polyamide acid derivative which is obtained by making polyamide acid react with one or more compounds and in accordance with formula 2,

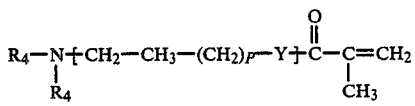

in which

R$_4$ is a hydrogen atom, a methyl group or an ethyl group,

Y is an oxygen atom or the group —N(R$_5$)—, in which

R$_5$ is a hydrogen atom or a methyl group, p has the value 0 or 1, and m has the value 0 or 1, on the condition that in at least one compound the value of m is 1.

Favorable results are obtained, in particular, when in the method a polyamide acid derivative is used which is obtained by having polyamide acid react with a mixture which contains 10 to 90 mol.% of a compound of formula 1 in which m=1 and R$_1$, R$_2$ R and X have the above-stated meaning and X 10 to 90 mol.% of a compound of formula 1 in which m=0 and R$_1$, R$_2$, R and have the above-stated meaning.

In each of these cases the ratio between the ratio between the number of equivalents of the compounds of formula 1 and 2 and the number of —COOH equivalents of the polyamide acid is greater than 0.05 and preferably greater than 0.3.

A suitable mixture contains 10–90 mol.% of a compound of formula 3

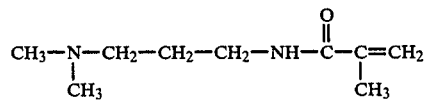

and 10–90 mol.% of a compound of formula 4

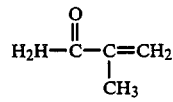

The product of the reaction between this mixture and polyamide acid is schematically represented in formula 5

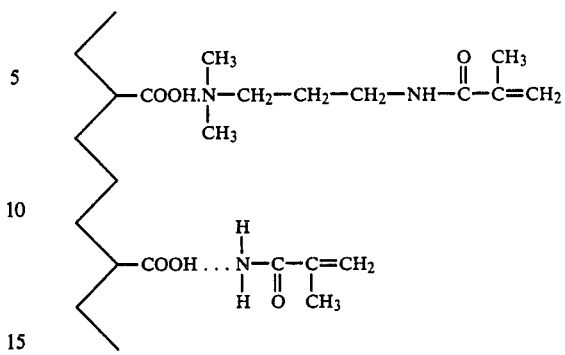

in which the zigzag line represents the polyamide acid chain, two carboxyl groups of which are shown. The remarkable thing about this is that the dimethylamino group of the dimethylaminopropylmethacryl acid amide (formula 3)

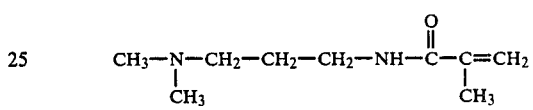

is connected to a carboxyl group of the polyamide acid by means of a salt bridge, and that the amino group of the methacrylic acid amide is connected to a carboxyl group of the polyamide acid or possibly to the acid amide group in the main chain of the polyamide acid by means of hydrogen bridges. A hydrogen bridge is indicated by three dots.

The above-described mixtures have the important advantage that upon imidisation of the relative polyamide acid derivative shrinkage is substantially reduced.

It should be noted that polyamide acid is also called polyimide precursor. It is a known and commercially available product. For a description of the material reference is made to U.S. Pat. No. 3,943,065 and to the published Netherlands Patent Application No. 8,202,688 (PHN 10.389), page 2 lines 6 to 34, filed by applicants.

After exposure of the assembly in two steps, the photoresist layer is developed. In this process the exposed parts dissolved. A suitable developer is, for example, a ketone such as methylisobutylketone. An electrically conductive layer is applied to the exposed surface of the developed photoresist layer. This layer is, preferably a metal layer such as chromium layer. The thickness of the chromium layer is, for example, 100 nm. The layer may be applied by known methods such as, for example, sputtering or vacuum deposition.

The remainder of the photoresist layer and the parts of the electrically conductive layer connected thereto are removed by treating them with, for example, chlorobenzene. Such a process is designated as "lift off".

The next step in the process in accordance with the invention is the removal of the unexposed parts of the polyamide acid derivative. By way of example, this developing step is carried out using dimethylacetamide-methanol (5:1). The exposed parts of the polyamide acid derivative are not removed because, due to exposure, complexing has taken place of the polyamide acid molecules with the polymer molecules developed by photopolymerisation of the compounds of formulae 1 and 2. By way of example, this is shown in formula 6

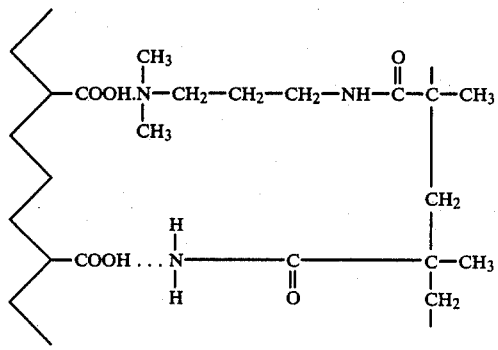

In this formula two methacrylamide groups are interconnected. This may be methacrylamide groups which are attached to the same polyamide acid chain, as shown in formula 6. The interconnected groups may also belong to different polyamide acid chains.

After the developing step, the exposed polyamide acid derivative is imidised by subjecting it to a heat treatment for, for example, 1 hour at 150° C. and 1 hour at 350° C. Preferably, the imidisation process is carried out in an $N_2$ atmosphere.

The invention also relates to a new photosensitive polyamide acid derivative which is obtained by making polyamide acid react with one or more compounds in accordance with formula 7

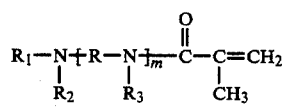

in which $R_1$ is equal to unequal to $R_2$ and both represent a lower alkyl group having 1-4 carbon atoms or one hydrogen atom, R is an alkylene group having 1-5 carbon atoms, $R_3$ is a lower alkyl group having 1-4 carbon atoms or a hydrogen atom, and m has the value 0 or 1, on the condition that in at least one compound reacted with the polyamide acid the value of m is 1.

This new derivative as schematically shown in FIG. 8

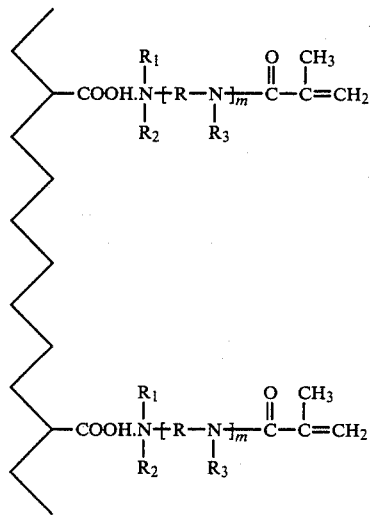

In comparison with that shown in the hereinbefore mentioned German Pat. No. 29 14 619, the new photosensitive polyamide acid derivative in accordance with the invention has the advantage that complexing under the influence of light proceeds more rapidly. In particular, the rate of the propagation reaction is increased by a factor of 10.

The photosensitive polyamide acid derivative produced in accordance with the invention may very suitably be used in the above-described method of manufacturing a polyimide structure. The polyamide acid derivative may also be used in the common method of manufacturing a polyimide pattern. In the common method, a layer of the polyamide acid derivative is exposed in accordance with a certain pattern, developed and converted to the polyimide.

A very suitable polyamide acid derivative in accordance with the invention, is obtained by making polyamide acid react with one or more compounds in accordance with formula 9

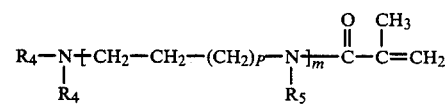

in which $R_4$ is a hydrogen atom, a methyl group or an ethyl group, $R_5$ is a hydrogen atom or a methyl group, p has the value 0 or 1, and m has the value 0 or 1, on the condition that in at least one compound reacted with the polyamide acid m has the value 1.

In an advantageous embodiment, the photosensitive polyamide acid derivative is the product formed by a reaction between polyamide acid and a mixture which contains 10-90 mol.% of a compound of formula 1 in which m=1 and $R_1$, $R_2$, R and X have the hereinbefore stated meaning and 10-90 mol.% of a compound of formula 1 in which m=0 and $R_1$, $R_2$, R and X have the hereinbefore stated meaning.

A very interesting polyamide acid derivative is the product by the result of a reaction between polyamide acid and a mixture containing 10-90 mol.% of a compound of formula 3 and 10–90 mol.% of a compound of formula 4.

Preferably, a mixture is used which contains 25 mol.% of the compound in accordance with formula 3 and 75 mol.% of a compound in accordance with formula 4.

The polyamide acid derivatives formed on the basis of the above-described mixtures have the advantage that shrinkage upon imidisation is reduced from, for example, 40 to 50% in the case of mono-component derivatives of polyamide acid to 30%.

The above-described method of applying polyimide layers in accordance with a certain pattern as well as the above-stated photosensitive polyamide acid derivates may be used in the manufacture of passivating layers, insulating layers or protective layers and the like for semiconductor arrangements. Alternatively they can be used in the manufacture of miniature circuits or masks for, for example, ion implantation.

A very interesting field of application is the production of an electrophoretic image-display cell.

The invention also relates to a new, improved electrophoretic image-display cell comprising two parallel cell walls at least one of which is transparent, one or more electrodes which are provided on the inside surface of each cell wall as well as a net-shaped electrode which is arranged between both cell walls, which net-shaped electrode runs parallel to the said cell walls and is supported by a dielectric layer having a network structure.

The improvement in accordance with the invention is characterized in that the dielectric layer is made of polyimide.

In an advantageous embodiment of the electrophoretic image-display cell, the polyimide dielectric layer which is provided with an electrode, is arranged in accordance with a desired pattern by use of the above-described method.

The invention will now be described in more detail with reference to the following exemplary embodiment and the drawing, in which FIGS. 1a through 1e are a schematic representations of the method in accordance with the invention.

EXAMPLE OF AN EMBODIMENT

Figure 1A:
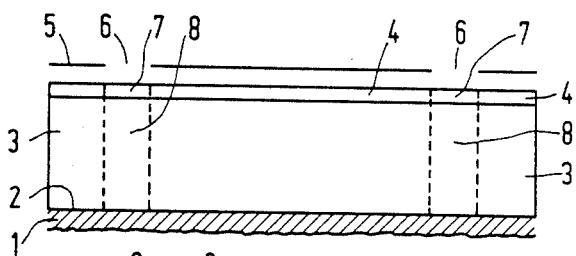

In FIG. 1 of the drawing transparent substrate 2 is made of glass. The substrate 1 may also be made of a transparent synthetic resin. An electrically conductive layer 2 of, for example, indium oxide or tin oxide is provided on the substrate 1. On the conductive layer 2 a layer 3 of a photosensitive derivative of polyamide acid, as described in detail in the introductory part is provided. Layer 3 has a thickness of, for example, 13 μm. Layer 3 is provided by dissolving the photosensitive polyamide acid derivative in a suitable solvent, such as N-methylpyrrolidone (15–20% solution). The solution is applied to layer 2 and the solvent is evaporated. The said solution of the photosensitive polyamide acid derivative is obtained by dissolving polyamide acid and a mixture of 25 mol.% of N,N-dimethylamino-propylmethacrylamide (formula 3) and 75 mol.% of methacrylamide (formula 4) in N-methylpyrrolidone and stirring the solution at room temperature for 30 minutes. The number of equivalents of N,N-dimethylaminopropylmethacrylamide corresponds to one fourth of the number of —COOH equivalents of the polyamide acid. A photoinitiator, such as Michler's ketone, is also added to the solution. The following substances may be used instead in the above-mentioned mixture:

N,N-dimethylaminoethyl methacrylate,
N,N-diethylaminoethyl methacrylate,
N-methylaminoethyl methacrylate,
N,N-dimethylaminopropyl methacrylate,
N-ethylaminoethyl methacrylate,
N-(N',N'-dimethylaminopropyl)N-methyl methacrylamide,
N-(N',N'-dimethylaminopropyl)methacrylamide,
N-(N',N'-dimethylaminoethyl)methacrylamide,
N-(N',N'-diethylaminopropyl)methacrylamide,
N-(N'-methylaminopropyl)N-methyl metacrylamide,
N-(N',N'-diethylaminoethyl)N-ethyl methacrylamide,
methacrylamide,
N-methylmethacrylamide and
N-ehtylmethacrylamide.

A layer 4 of polymethylmethacrylate (PMMA) having a thickness of 0.1–0.2 μm is applied to layer 3. For this purpose a solution of PMMA in chlorobenzene is used.

Figure 1B:
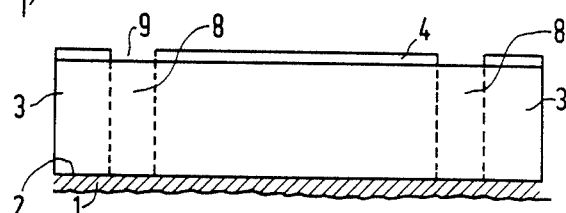
Figure 1C:
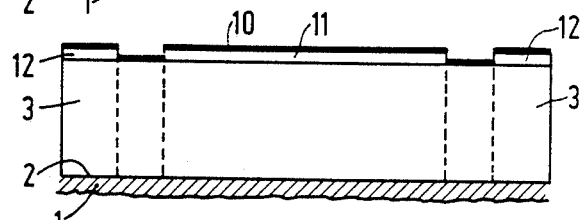
Figure 1D:
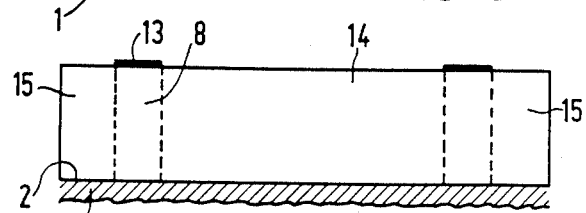
Figure 1E:
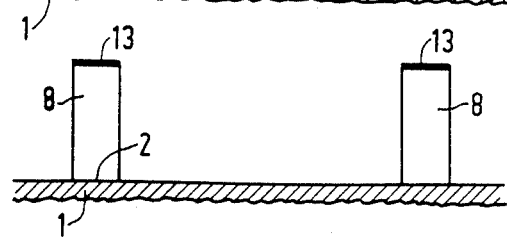

The layers 3 and 4 are exposed through openings 6 in a quartz mask 5. The exposure is carried out in two steps. The first exposure step is carried out using DUV. having a wavelength of 220 nm. In this step the portions 7 of layer 4 are exposed. Immediately afterwards UV light having a wavelength of 360 nm is used to expose the portions 8 of layer 3. The exposed portions 7 of layer 4 are removed by treating (developing) them with methylisobutylketone (FIG. 1b). Subsequently, a layer of chromium 10 having a thickness of 100 nm is applied by evaporation (FIG. 1c). The unexposed portions 11 and 12 of layer 4 as well as the chromium layer 10 present on these portions are removed by subjecting them to a chlorobenzene treatment (lift-off proces) (FIG. 1d). The unexposed portions 14 and 15 of layer 3 are removed (developed) using a mixture 5:1 of dimethylacetamide and methanol (FIG. 1e). The remaining portions 8 of layer 3 which are provided on the upper surface with a chromium layer 13 are imidised by heating them at 150° C. for 1 hour and at 350° C. for 1 hour.

Figure 2:
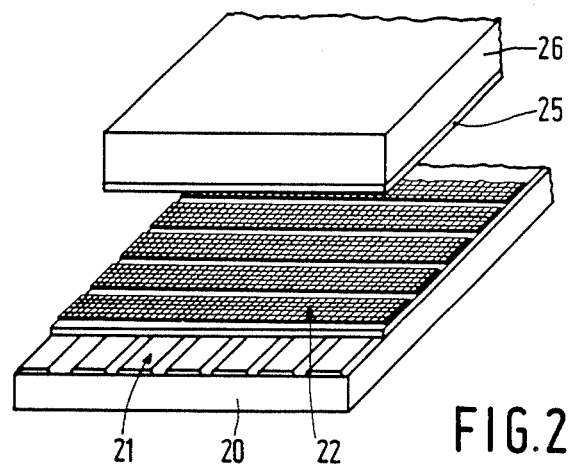
FIG. 2 is a perspective view of an electrophoretic image-display cell.

An electrophoretic image-display cell of known construction is shown in perspective in FIG. 2. Such an electrophoretic image-display cell is known from for example, Proceedings Conf. '80, Biennical Display Research Conf., Cherry Hill, USA, Oct. 21-28, 1980.

Figure 3:
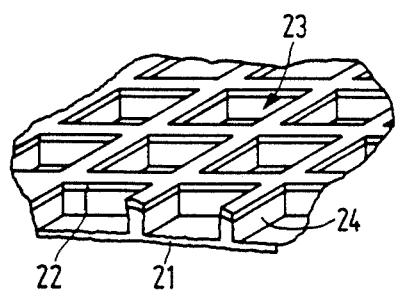
FIG. 3 is a perspective view of a detailed representation of the supported net-shaped electrode in the image-display cell in accordance with FIG. 2.

Reference numeral 20 in FIG. 2 denotes a transparent substrate plate which is made of, for example, glass or a transparent synthetic resin. So-called row electrodes 21 are provided on the substrate 20, which electrodes are made of, for example, transparent indium oxide or tin oxide. The electrodes 21 have a thickness of a few microns. The width of each row electrode is approximately 220 μm, the interspace between the row electrodes is 30 μm. Column electrodes 22 are provided at a distance of approximately 11 μm from the row electrodes. Each column electrode has a width of approximately 220 μm. The interspace between the individual column electrodes is 30 μm. Each column electrode has a network structure 23 as is clearly shown in FIG. 3. The column electrode is made of, for example, Cr and has a thickness of approximately 0.1. μm. The column or net-shaped electrode 22 is supported by a dielectric layer 24 which has the same network structure as the column electrode 22. The dielectric layer 24 is supported by the row electrode 21. In accordance with the invention, the dielectric network layer 24 consists of polyimide. This polyimide pattern and the column electrode 22 situated thereon can be produced by the above described method of the invention. Surprisingly it has been found that by carrying out the method in accordance with the invention very straight wall portions of the polyimide pattern are obtained. Thanks to these straight wall portions, the quality and particularly the functioning of the image display cell are very much improved. An anode 25 is provided at a distance of 50 μm from the column electrodes 22. Anode 25 is made of, for example, indium oxide or tin oxide. Anode 25 is supported by a supporting plate 26 which may be made of a transparent or untransparent material such as glass, synthetic resin. Substrate 20 and supporting plate 26 are interconnected at the location of the outer edge by means of an annular spacer which is not shown in the Figures. The dimensions of the image-display cell are not clearly defined. Consequently, they may vary substantially. A suitable size is, for example, 4×6 cm or 9×16 cm. In the latter case the image-display cell contains 360 row electrodes and 640 column electrodes.

Figure 4:
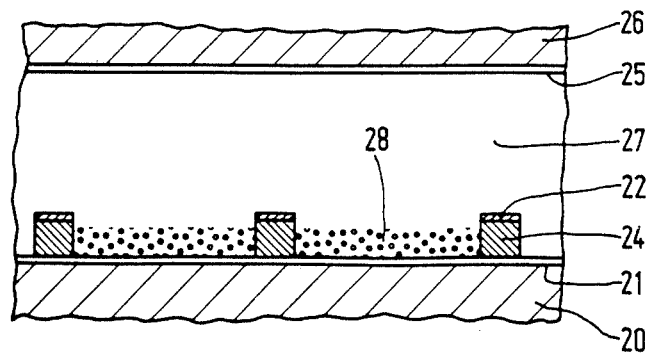
FIG. 4 is a cross-sectional view of a portion of the image-display cell in accordance with FIG. 2 and FIG. 3.

The operation of the image-display cell, which is known per se, is again explained by means of FIG. 4. Components of FIG. 4 which correspond to components of the FIGS. 2 and 3, bear the same reference numerals. The image-display cell is filled with a cell medium 27 which contains a dielectric liquid in which charged particles 28 are dispersed. The particles are, for example, negatively charged $TiO_2$ particles. A dye is dissolved in the dielectric liquid, for example, a red dye which contrasts with the white colour of the $TiO_2$ particels.

Initially, for example, the anode 25 has a positive voltage of 100 V. All $TiO_2$ particles 28 are situated against the anode 25. Consequently, the image-display cell, which is looked at through substrate 20, has the colour of the dye dissolved in the medium, which is red in this case. The column electrodes have a voltage of, for example, 0 V and the row electrodes have a voltage of 30 V. By decreasing the anode voltage to 0 V, the particles will move towards the position indicated in FIG. 4. The particles are located in the so-called potential wells. If the original voltage of 100 V is again applied to anode, the particles will remain in the potential wells due to the difference in potential (30 V) between row electrodes 21 and column electrodes 22. Looking at the image through the substrate 20, the image-display cell has a white ($TiO_2$) colour. Decreasing the voltage applied to the row electrodes to 15 V and increasing that applied to the column electrodes to 15 V will make the particles move towards the anode. As the row electrodes and the column electrodes are arranged so that they cross each other, a matrix structure is achieved each segment of which is electrically controlled to obtain the desired image.

What is claimed is:

1. A method of forming a patterned polyimide film on a substrate, which patterned polyimide film is provided with an electrically conductive layer at its surface facing away from the substrate, said method comprising:

(a) providing said substrate with a layer of a negative-acting photosensitive polyamide acid derivative which is obtained by reacting polyamide acid with at least one compound of the formula 1

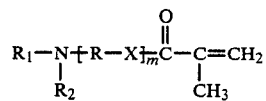

in which $R_1$ and $R_2$ both independently represent a lower alkyl group of 1–4 carbon atoms or a hydrogen atom, R is an alkylene group of 1–5 carbon atoms, X is an oxygen atom or the group $-N(R_3)-$, in which $R_3$ is a hydrogen atom or a lower alkyl group of 1–4 carbon atoms, and m has the value 0 or 1, on the condition that in at least one compound that is used the value of m is 1;

(b) applying a layer of a photosensitive photoresist on said layer of photosensitive polyamide derivative;

(c) exposing the resultant assembly patternwise;

(d) developing the resultant patternwise exposed photoresist layer to remove the exposed portions of said photoresist layer;

(e) applying to the remaining portions of said photoresist layer and to the exposed portions of said layer of the polyamide derivative an electrically conductive layer;

(f) removing, by means of a lift-off process, the remaining portions of said photoresist layer and the overlying portions of said electrically conductive layer; and (g) subjecting portions of said polyamide derivative remaining on said substrate to a heat treatment and imidization to form a polyimide.

2. A method as claimed in claim 1, characterized in that a positive photoresist is used whose absorption wavelength differs from that of the photosensitive polyamide acid derivative, the exposure of the assembly in accordance with a certain pattern being carried out in two successive steps, the first step consisting in exposing the assembly in accordance with a certain pattern to light whose emission wavelength corresponds to the absorption wavelength of the photoresist, and the second step consisting in exposing the assembly in accordance with a desired pattern to light whose emission wavelength corresponds to the absorption wavelength of the photosensitive polyamide acid derivative.

3. A method as claimed in claim 2, characterized in that a positive photoresist is used having an absorption wavelength situated in the near UV spectrum and a polyamide acid derivative is used having an absorption wavelength situated in the UV spectrum.

4. A method as claimed in claim 3, characterized in that a layer of polymethylmethacrylate is used as a positive photoresist.

5. A method as claimed in claim 3, characterized in that the polyamide acid derivative used is obtained by reacting polyamide acid with one or more compounds in accordance with the formula 2

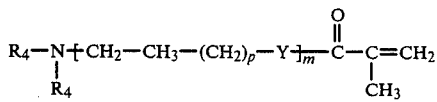

in which formula $R_4$ is a hydrogen atom, a methyl group or an ethyl group,

Y is oxygen or the group $-N(R_5)-$, in which $R_5$ is hydrogen or methyl, p has the value 0 or 1, and m has the value 0 or 1, on the condition that at least in one compound that is used the value of m is 1.

6. A method as claimed in claim 3, characterized in that a polyamide acid derivative is used which is obtained by reacting polyamide acid with a mixture containing 10-90 mol.% of a compound of formula 1 in which m=1 and 10-90 mol.% of a compound of formula 1 in which m=0.

7. A method as claimed in claim 6, characterized in that a polyamide acid derivative is used which is obtained by reacting polyamide acid with a mixture containing 10-90 mol.% of a compound of the formula

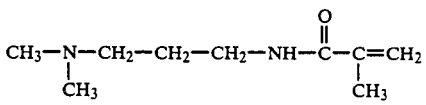

and 10-90 mol.% of a compound of the formula

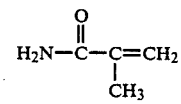

* * * * *